(12) United States Patent
Tamura

(10) Patent No.: US 6,900,676 B1
(45) Date of Patent: May 31, 2005

(54) CLOCK GENERATOR FOR GENERATING ACCURATE AND LOW-JITTER CLOCK

(75) Inventor: Hirotaka Tamura, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/625,879

(22) Filed: Jul. 24, 2003

(30) Foreign Application Priority Data

Aug. 27, 2002 (JP) ........................................ 2002-247450

(51) Int. Cl.[7] .............................................. H03L 7/06
(52) U.S. Cl. ........................ 327/156; 327/162; 327/147; 375/376
(58) Field of Search .............................. 327/143–148, 327/154–157, 162, 165, 141, 2, 3, 7, 8, 12; 375/327, 375, 376; 331/1 A, 1 R, 11, 18, 25, DIG. 2

(56) References Cited

U.S. PATENT DOCUMENTS

| | | | | |
|---|---|---|---|---|
| 5,075,639 A | * | 12/1991 | Taya ............................... | 331/2 |
| 5,323,242 A | * | 6/1994 | Yamamoto et al. ............ | 386/41 |
| 5,483,180 A | * | 1/1996 | Chai et al. ..................... | 326/93 |
| 5,666,084 A | | 9/1997 | Schulz et al. ................. | 329/307 |
| 5,953,386 A | * | 9/1999 | Anderson .................... | 375/376 |
| 6,236,697 B1 | * | 5/2001 | Fang ........................... | 375/376 |
| 6,249,160 B1 | * | 6/2001 | Tagami et al. ............... | 327/165 |
| 6,496,555 B1 | * | 12/2002 | Soda ........................... | 375/376 |
| 6,600,797 B1 | * | 7/2003 | Hasegawa et al. ........... | 375/376 |
| 6,606,365 B1 | * | 8/2003 | Chen .......................... | 375/376 |
| 2003/0071665 A1 | | 4/2003 | Oyama | |

FOREIGN PATENT DOCUMENTS

WO    WO 00/31914    6/2000

* cited by examiner

Primary Examiner—Timothy P. Callahan
Assistant Examiner—Hai L. Nguyen
(74) Attorney, Agent, or Firm—Arent Fox PLLC

(57) ABSTRACT

A clock generator has a clock generating circuit, a phase difference detection circuit, and a control signal generating circuit. The clock generating circuit has a function for varying a clock phase in accordance with a control signal, the phase difference detection circuit compars the clock phase output from the clock generating circuit with a phase of a reference waveform, and detecting a phase difference therebetween, and the control signal generating circuit generates a control signal for controlling the clock phase of the clock generating circuit, based on phase difference information obtained from the phase difference detection circuit. The phase difference detection circuit has a plurality of phase detection units, at least one of the plurality of phase detection units carries out a direct phase detection in which a phase of the clock is directly compared with the phase of the reference waveform, and at least the other one of the plurality of phase detection units carries out an indirect phase detection using a phase-synchronized waveform generating circuit generating a waveform synchronized in phase with the reference waveform or an output of the clock generating circuit and a phase information extracting circuit extracting phase information from the phase-synchronized waveform.

16 Claims, 11 Drawing Sheets

CLOCK GENERATOR FOR GENERATING ACCURATE AND LOW-JITTER CLOCK

CROSS REFERENCE TO RELATED APPLICATION

This application is based upon and claims the benefit of priority from prior Japanese Patent Application No. 2002-247450, filed on Aug. 27, 2002, the entire contents of which are incorporated herein by reference.

BACKGROUND OF THE INVENTION

1. Field of the Invention

The present invention relates to a signal transmission technology for enabling high-speed signal transmission between a plurality of LSI chips or a plurality of devices or circuit blocks within a single chip, or between a plurality of boards or cabinets and, more particularly, to a clock generator to be used for high bit-rate signal transmission.

2. Description of the Related Art

Recently, the performance of components used in computers and other information processing apparatuses has been greatly improved. In particular, dramatic improvements have been made, for example, in the performance of semiconductor memory devices such as SRAMs (Static Random Access Memories) and DRAMs (Dynamic Random Access Memories), and other semiconductor devices such as processors and switching LSIs.

The improvements in the performance of semiconductor memory devices, processors, and the like have reached the point where system performance cannot be improved further unless the speed of signal transmission between components or elements is increased. Specifically, the speed gap between a DRAM and a processor (i.e., between LSIs), for example, has been widening year by year and, in recent years, this speed gap has been becoming a bottleneck impeding performance improvement for a computer as a whole. Furthermore, with increasing integration and increasing size of semiconductor chips, the speed of signal transmission between elements or circuit blocks within a chip is becoming a major factor limiting the performance of the chip. Moreover, the speed of signal transmission between a peripheral device and the processor/chipset is also becoming a factor limiting the overall performance of the system.

Furthermore, the need for an improvement in signal transmission speed is increasing not only for signal transmission between cabinets or boards (printed wiring boards), for example, between a server and a main storage device or between servers connected via a network, but also for signal transmission between chips or between devices or circuit blocks within a single chip because of increasing integration and increasing size of semiconductor chips and decreasing supply voltage levels (decreasing signal amplitude levels), etc. Moreover, the speed of signal transmission between a peripheral device and the processor/chipset also is becoming a major factor limiting the overall system performance. It is also strongly desired to improve the speed of signal transmission in the so-called back plane (also called the back wiring board BWB) where interconnections are made between circuit boards within an apparatus.

Generally, in high-speed signal transmission between circuit blocks or chips or between cabinets, the clock to be used to discriminate between data "0" (low level "L") and data "1" (high level "H") is generated (recovered) at the receiving circuit side. To achieve correct signal transmission and reception, it is required that variations in the clock rise time (deviations from the ideal periodic timing), called jitter, be reduced, and it is therefore strongly desired to provide a clock generator that can generate an accurate, low-jitter clock.

The prior art and its associated problem will be described in detail later with reference to relevant drawings.

SUMMARY OF THE INVENTION

An object of the present invention is to provide a clock generator that can generate an accurate, low jitter clock, whether when generating an internal clock from data having a low clock transition rate or when generating an internal clock by multiplying an external clock by a high multiplication factor.

According to the present invention, there is provided a clock generator comprising a clock generating circuit having a function for varying a clock phase in accordance with a control signal; a phase difference detection circuit comparing the clock phase output from the clock generating circuit with a phase of a reference waveform, and detecting a phase difference therebetween; and a control signal generating circuit generating a control signal for controlling the clock phase of the clock generating circuit, based on phase difference information obtained from the phase difference detection circuit, wherein the phase difference detection circuit comprises a plurality of phase detection units; at least one of the plurality of phase detection units carries out a direct phase detection in which a phase of the clock is directly compared with the phase of the reference waveform; and at least the other one of the plurality of phase detection units carries out an indirect phase detection using a phase-synchronized waveform generating circuit generating a waveform synchronized in phase with the reference waveform or an output of the clock generating circuit and a phase information extracting circuit extracting phase information from the phase-synchronized waveform.

In direct phase detection, the phase of the clock may be compared with the phase of the reference waveform at a first frequency; and in the indirect phase detection, the phase of the clock may be compared with the output of the phase-synchronized waveform generating circuit at a second frequency higher than the first frequency. The direct phase detection may be carried out by detecting a phase difference between the clock and externally supplied data; and the indirect phase detection may be carried out by detecting a phase difference between the clock and a data clock synchronized to the externally supplied data. The clock generator may further comprise a clock phase adjusting circuit adjusting the phase of the clock in accordance with a signal generated by the plurality of phase detection units, and wherein a response speed characteristic that affects the phase of the clock may be different for each output of the plurality of phase detection units.

Data may be transmitted on a plurality of data lines for one data clock line on which the data clock is transmitted; the data clock line and the data lines may be each provided with a clock generating circuit; the clock generating circuit provided on the data clock line may detect a phase difference between the clock generated by the clock generating circuit and the data clock, adjust the phase of the clock based on a value of the detected phase difference, supply the control signal used for adjusting the phase to the clock generating circuit provided on each of the data lines, and generate a clock control signal based on the supplied control signal and on a signal representing the phase difference between the clock and the data on the data line. A value corresponding to a rate of increase in the phase of the data clock may be obtained based on phase information obtained from the phase detection unit associated with the data clock line, and may be supplied to the clock phase adjusting circuit on the each data line where the clock phase is adjusted based on information concerning the value and on information concerning the phase difference between the clock and the data on the data line.

Detection of the clock phase may be carried out by using the phase difference detection circuit comparing an external reference clock with the clock generated by the clock generating circuit, and detecting a phase difference therebetween; and a phase detection circuit detecting a phase of a PLL or DLL when the clock output from the clock generating circuit is supplied to the PLL or DLL. A value obtained from a phase comparison between the external reference clock and the clock output from the clock generating circuit may control the phase of the clock generating circuit with a long time constant, and phase information obtained from the phase detection circuit of the PLL or DLL may control the phase of the clock generating circuit with a shorter time constant.

Further, according to the present invention, there is also provided a clock generator comprising a first phase comparator carrying out a phase comparison between an externally supplied reference signal and an internal clock; a phase-synchronized clock generating circuit generating a comparison clock synchronized in phase to the reference signal and having a higher clock transition rate than the reference signal; a second phase comparator carrying out a phase comparison between the comparison clock and the internal clock; an adder summing first phase difference information obtained from the first phase comparator and second phase difference information obtained from the second phase comparator; and an internal clock generating circuit generating the internal clock whose phase is adjusted in accordance with an output of the adder.

The clock generator may further comprise a low-pass filter allowing low frequencies contained in an output of the first phase comparator to be transmitted therethrough and supplied to the adder; and a high-pass filter allowing high frequencies contained in an output of the second phase comparator to be transmitted therethrough and supplied to the adder. The reference signal may be an externally supplied reference clock, and the internal clock may be generated by multiplying the reference clock. The phase-synchronized clock generating circuit may be a multiplying circuit.

The reference signal may be externally supplied data, and the internal clock may be a clock for receiving the data. The reference clock may be a data clock transmitted on one data clock line with respect to data transmitted in parallel on a plurality of data lines; the internal clock may be generated as a plurality of data receiving clocks for receiving the respective data transmitted on the plurality of data lines; the second phase comparator may be provided one for the data clock line; the first phase comparator, the adder, and the internal clock generating circuit may be provided for each of the plurality of data lines; each of the adders may sum the first phase difference information obtained from the first phase comparator associated therewith and the second phase difference information obtained from the second phase comparator; and each of the internal clock generating circuits may generate the internal clock whose phase is adjusted in accordance with an output of the adder associated therewith.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

Before proceeding to the detailed description of the preferred embodiments of the clock generator according to the present invention, a prior art clock generator and its associated problem will be described below with reference to FIG. 1.

Generally, clock generation for high-speed signal transmission is accomplished in two ways. One is to regenerate the clock from the received data; this technique is called CDR (Clock and Data Recovery) because discrimination between data "0" and "1" is done using the regenerated clock, The other one, though it is one form of the CDR technique in its broad sense, is to create a clock of the necessary frequency within a chip from a reference clock supplied from outside the chip. Depending on the CDR method, a high-frequency reference clock may be needed, and the CDR technique is also used to create a clock for that purpose. A transmitter (Tx) for performing high-speed signal transmission also needs a high-frequency clock. Since it is not practical to supply such high-frequency clocks directly from outside the chip, it is preferable to supply a lower frequency clock to the chip and generate the necessary clock within the chip by multiplying the low-frequency clock.

Generally, a PLL (Phase Locked Loop) is used to multiply the clock and, in such a clock also, it is required that jitter be reduced. Here, the principle of operation used is substantially the same for both the CDR and the clock multiplication.

Figure 1:
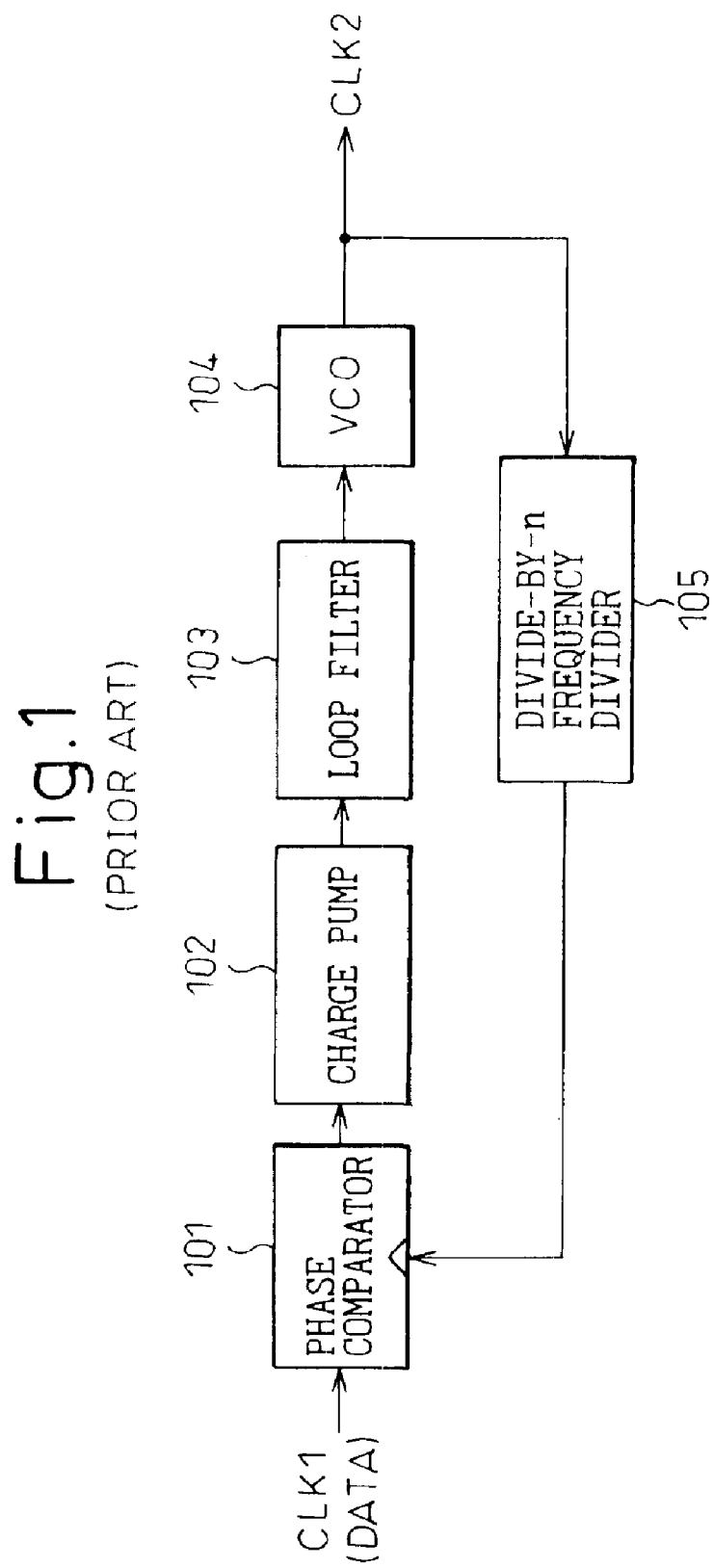
FIG. 1 is a block diagram showing one example of a prior art clock generator.

FIG. 1 is a block diagram showing one example of the prior art clock generator. In FIG. 1, reference numeral 101 is a phase comparator, 102 is a charge pump, 103 is a loop filter, 104 is a VCO (Voltage Controlled Oscillator), and 105 is a divide-by-n frequency divider.

As shown in FIG. 1, in the prior art clock generator, an external reference clock (external clock) CLK 1 or input data DATA is supplied to the phase comparator 101, and the phase of an internal clock CLK 2 is adjusted by comparing the phase of the external clock CLK 1 with the output of the divide-by-n frequency divider 105 to be described later. This phase adjustment is usually performed by means of the VCO 104. That is, the charge pump 102 is driven by the output of the phase comparator 101, and the output of the charge pump 102 is passed through the loop filter 103 and supplied as a control voltage to the VCO 104 whose oscillation frequency is controlled by this control voltage.

The output of the VCO 104 is supplied as the internal clock CLK 2 to various circuits within the chip and, at the same time, it is fed back to the phase comparator 101 via the divide-by-n frequency divider 105. Specifically, consider an example where a 50-MHz clock is supplied as the external clock CLK 1 and a 5-GHz clock is generated as the internal clock CLK 2 by multiplying the external clock by 100; in this case, the output (internal clock CLK 2) of the VCO 104 is divided by 100 by the divide-by-n frequency divider 105 and fed back to the phase comparator 101 where the phase is compared with the phase of the external clock CLK 1. On the other hand, in the case where the data (input data DATA) and the internal clock CLK 2 are compared in the phase comparator 101, usually the internal clock CLK 2 is not divided.

When recovering the clock from the data (input data DATA), there can occur cases where the transition rate at which the data makes a transition from a 0 to a 1 or from a 1 to a 0 is not high enough. For example, in the case of data where no coding is applied, there are cases where 0s or 1s are transmitted in succession; in such cases, the phase comparison is performed less frequently, and during the period where the phase comparison is not performed, the phase difference between the internal clock (CLK 2) and the data (DATA), that is, the jitter, may increase.

Likewise, when generating the internal clock (CLK 2) by multiplying the external clock (CLK 1), if the multiplication factor is high, a problem similar to the problem described above, when recovering the clock from the data, can occur. That is, when the multiplication factor is high, the interval at which the phase comparison is performed increases, decreasing the frequency at which the phase difference is corrected, and as a result, the phase error (jitter) increases.

Next, the basic configuration of the clock generator according to the present invention will be described with reference to FIG. 2.

Figure 2:
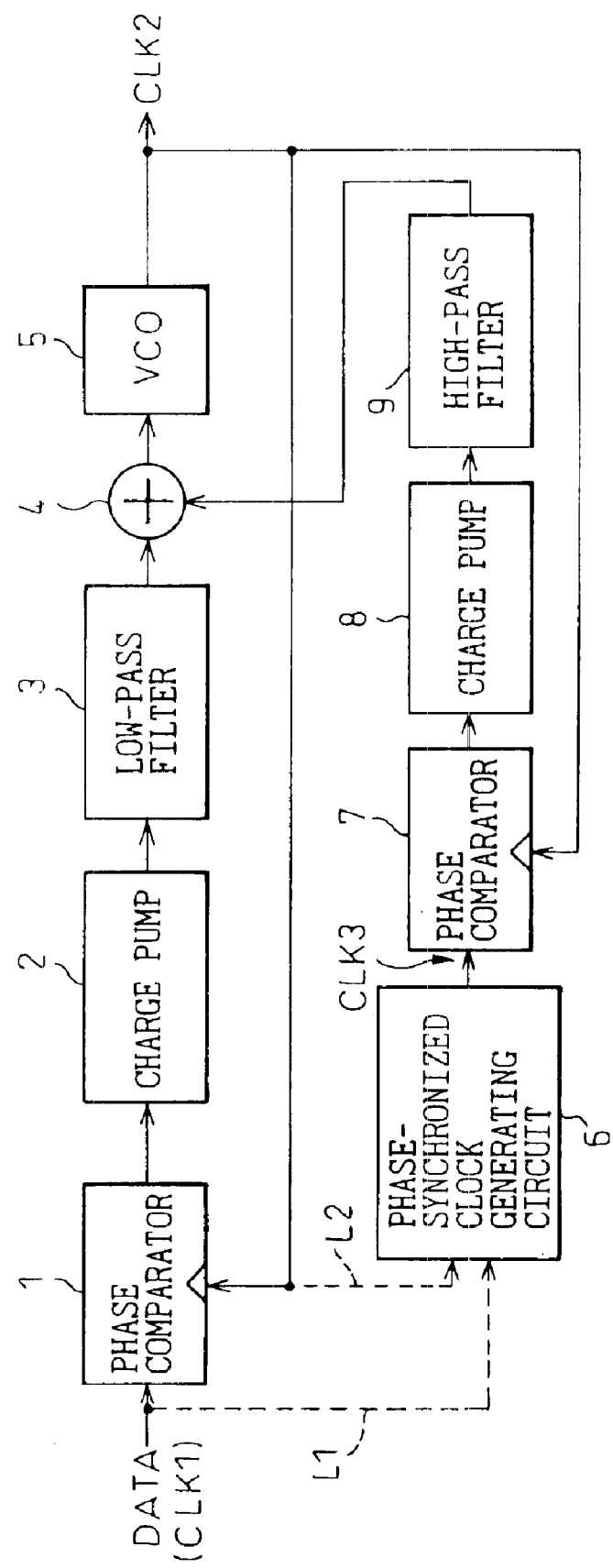
FIG. 2 is a block diagram showing the basic configuration of a clock generator according to the present invention.

FIG. 2 is a block diagram showing the basic configuration of the clock generator according to the present invention. In FIG. 2, reference numerals 1 and 7 are phase comparators (phase detection units), 2 and 8 are charge pumps, 3 is a low-pass filter, 4 is an adder, 5 is a VCO (Voltage Controlled Oscillator as a clock generating circuit), 6 is a phase-synchronized clock generating circuit (phase-synchronized signal generating circuit), and 9 is a high-pass filter.

As shown in FIG. 2, in the clock generator according to the present invention, input data DATA (or reference clock (external clock) CLK 1 to be multiplied) is supplied to the phase comparator 1, for example, from outside the clock generator, and the input data DATA is compared in phase with the internal clock CLK 2 output from the VCO 5. The output of the phase comparator 1 is supplied to the charge pump 2 to drive the charge pump 2, whose output is supplied to the adder 4 via the low-pass filter 3. The VCO 5 is controlled by a signal (control voltage) output from the adder 4, i.e., the sum of the output of the low-pass filter 3 and the output of the high-pass filter 9.

Here, as shown by a dashed line L1 in FIG. 2, the phase-synchronized clock generating circuit 6 is supplied with the external input data DATA (or the external clock CLK 1) and supplies to the phase comparator 7 a comparison clock CLK 3 phase-synchronized to the input data (received data) DATA, or as shown by a dashed line L2 in FIG. 2, the phase-synchronized clock generating circuit 6 is supplied with the internal clock CLK 2 and supplies to the phase comparator 7 a comparison clock CLK 3 phase-synchronized to the internal clock CLK 2. Here, the comparison clock CLK 3 output from the phase-synchronized clock generating circuit 6 is a clock synchronized to the input data DATA or the internal clock CLK 2, but the number of its clock transitions is set larger than that for the input data DATA or the internal clock CLK 2.

The phase comparator 7 compares the phase of the output of the phase-synchronized clock generating circuit 6, i.e., the comparison clock CLK 3 having the higher number of clock transitions, with the phase of the internal clock CLK 2 output from the VCO 5. The output of the phase comparator 7 is supplied to the charge pump 8 to drive the charge pump 8, whose output is supplied to the adder 4 via the high-pass filter 9. The oscillation frequency of the VCO 5 (the frequency of the internal clock CLK 2) is controlled by the output (control voltage) of the adder 4, i.e., the sum of the output of the low-pass filter 3 and the output of the high-pass filter 9.

As described above, the comparison clock CLK 3 output from the phase-synchronized clock generating circuit 6 is synchronized in phase to the input data DATA or the internal clock CLK 2, but has a higher clock transition rate than the received data, and the phase information obtained from the phase comparator 7 contains phase information of the internal clock up to high frequency components. However, as, in the phase comparator 7, a finite phase error occurs between the received data and the comparison clock CLK 3, if control is performed using the phase comparator 7 alone, a phase error also occurs between the internal clock CLK 2 and the received data. This error can lead to variations in low frequencies including the DC component.

In view of this, in the clock generator according to the present invention, the low frequency portion of the phase difference obtained from the phase comparator 1 (no phase error occurs here) is supplied to the adder 4 via the low-pass filter 3, while the high frequency portion of the phase difference obtained from the phase comparator 7 is supplied to the adder 4 via the high-pass filter 9, and the output of the low-pass filter 3 and the output of the high-pass filter 9 are summed together in the adder 4 to obtain the phase difference signal free from errors from low to high frequencies. That is, the phase difference signal based on the output of the phase comparator 1 that contains less error in the low frequency range, though the frequency of the phase comparison (phase detection) is low, is combined in the adder 4 with the phase difference signal based on the output of the phase comparator 7 that can provide a sufficiently high phase comparison frequency and can measure the phase error in the high frequency portion, and the VCO 5 is controlled by the output of this adder 4; since the phase comparison is performed over a wide frequency range as described above, the internal clock CLK 2 can be generated by reducing the phase error (jitter).

In this way, according to the present invention, a low jitter clock can be generated, whether when generating the internal clock from the data having a low clock transition rate or when generating the internal clock by multiplying the external clock by a high multiplication factor, and thus, a receiving circuit having a large timing margin and a clock generator capable of accurate clock generation can be achieved.

Various embodiments of the clock generator according to the present invention will be described below with reference to the accompanying drawings.

Figure 3:
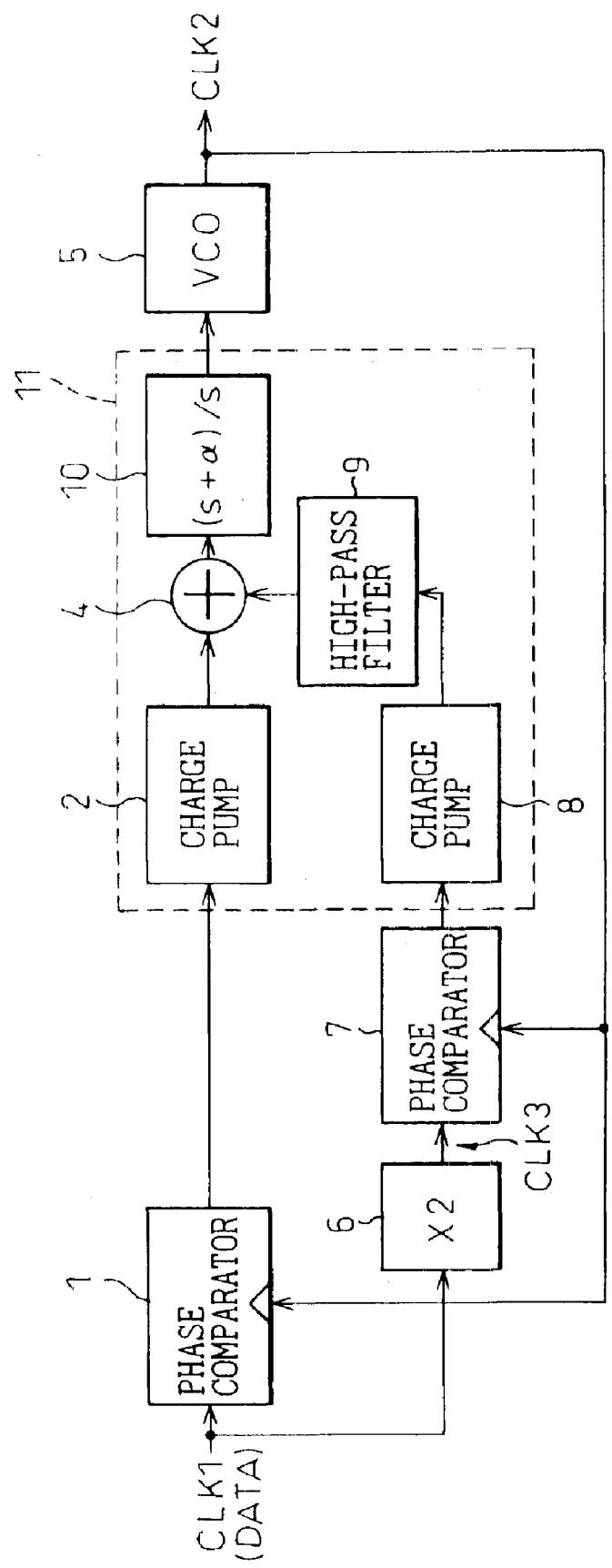
FIG. 3 is a block diagram showing a first embodiment of the clock generator according to the present invention.

FIG. 3 is a block diagram showing a first embodiment of the clock generator according to the present invention. In FIG. 3, reference numerals 1 and 7 are phase comparators, 2 and 8 are charge pumps, 4 is an adder, 5 is a VCO (Voltage Controlled Oscillator), 6 is a multiply-by-2 circuit (phase-synchronized clock generating circuit), 9 is a high-pass filter, 10 is a processing circuit, and 11 is a control signal generating circuit.

As shown in FIG. 3, in the clock generator of the first embodiment, the phase comparator 1 compares the phase of the external clock CLK 1 (or the input data DATA) with the phase of the internal clock CLK 2 output from the VCO 5, while the phase comparator 7 compares the phase of the external clock multiplied by 2 by the multiply-by-2 circuit 6 (the phase of the comparison clock CLK 3) with the phase of the internal clock CLK 2.

The outputs of the phase comparators 1 and 7 are supplied to the control signal generating circuit 11, and the VCO 5 is controlled by the control signal (control voltage) output from the control signal generating circuit 11 and thus outputs the phase-controlled internal clock CLK 2. The control signal generating circuit 11 comprises the charge pump 2 which is driven by the output of the phase comparator 1, the charge pump 8 which is driven by the output of the phase comparator 7, the adder 4 which sums the output of the charge pump 2 and the output of the charge pump 8 supplied via the high-pass filter 9, and the processing circuit 10 which performs an integration process of the output of the adder 4 and then a first-order zero process ((s+α)/S).

That is, in the control signal generating circuit 11, the output of the charge pump 8, driven by the output of the phase comparator 7, and passed through the high-pass filter 9 to cut off the lower frequency portion, is input to the adder 4 where it is summed with the output of the charge pump 2 driven by the output of the phase comparator 1, and the resulting sum is input to the processing circuit 10 which performs the prescribed integration (s+α)/s; then, the VCO 5, with its operation controlled by the output of the processing circuit 10, generates the internal clock CLK 2.

In this way, according to the clock generator of the first embodiment, as the phase comparator 7 compares the phase of the external clock multiplied by 2 by the multiply-by-2 circuit 6 (the phase of the comparison clock CLK 3) with the phase of the internal clock CLK 2, the cut-off frequency of the phase comparison improves by a factor of 2. Here, the comparison clock CLK 3 that the multiply-by-2 circuit 6 outputs is synchronized in phase with the external clock CLK 1 (though they differ in frequency since one is a multiple of the other), but a static phase error (variations in low frequencies including the DC component) does exist. However, the low frequency portion of the phase difference signal obtained from the comparison clock CLK 3 produced by multiplying the external clock CLK 1 by 2 is cut off by the high-pass filter 9, and the adder 4 sums the output of the high-pass filter 9 with the phase difference signal obtained from the conventional phase detection means (phase comparator 1 and charge pump 2); as a result, a phase difference signal free from errors in the low frequency portion can be obtained over a wide frequency range.

Figure 4:
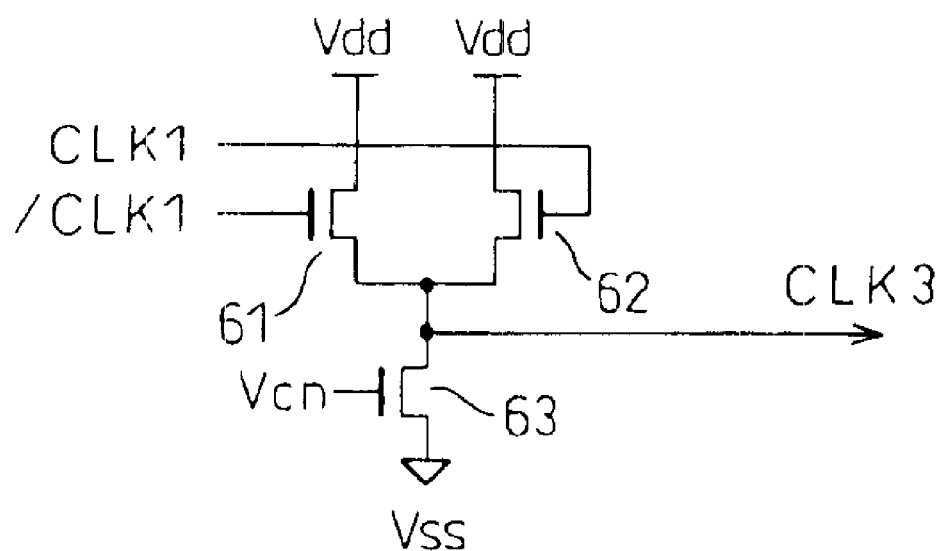
FIG. 4 is a circuit diagram showing one example of a multiply-by-2 circuit in the clock generator of FIG. 3.

FIG. 4 is a circuit diagram showing one example of the multiply-by-2 circuit in the clock generator of FIG. 3.

As shown in FIG. 4, the multiply-by-2 circuit 6 comprises nMOS transistors 61 to 63; here, differential input clocks CLK 1 and /CLK 1 are supplied to the gates of the transistors 61 and 62 and the output (comparison clock CLK 3) is taken from the node connecting between the common source of the transistors 61 and 62 and the drain of the transistor 63. That is, the comparison clock CLK 3 is produced by multiplying the input clock (external clock) CLK 1 by 2, and in the phase comparator 7, the comparison clock CLK 3 whose frequency is twice the frequency of the external clock CLK 1 is compared in phase with the internal clock CLK 2.

Figure 5:
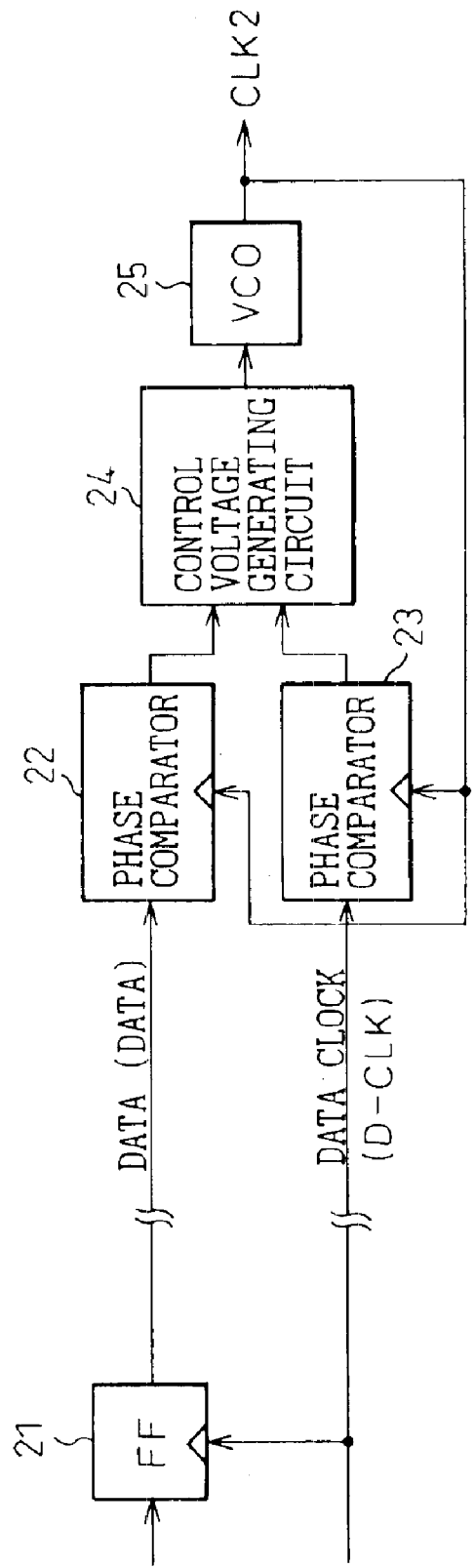
FIG. 5 is a block diagram showing a second embodiment of the clock generator according to the present invention.

FIG. 5 is a block diagram showing a second embodiment of the clock generator according to the present invention, in which an internal clock synchronized to externally supplied data is generated. In FIG. 5, reference numeral 21 is a flip-flop circuit (FF circuit), 22 and 23 are phase comparators, 24 is a control voltage generating circuit (control signal generating circuit), and 25 is a VCO.

In the clock generator of the foregoing first embodiment shown in FIG. 3, the phase-synchronized clock is generated at the receiving side, but in the clock generator of the second embodiment shown in FIG. 5, the phase-synchronized clock is generated at the transmitting side. More specifically, the driving clock for the FF circuit 21 used in the circuit for generating the output data is used as the data clock D-CLK and is transmitted together with the data. At the receiving side, the phase comparator 22 compares the phase of the internal clock CLK 2 (the output clock of the VCO 25) with the phase of the data DATA, and the phase comparator 23 compares the phase of the internal clock CLK 2 with the phase of the data clock D-CLK.

Of the outputs of the two phase comparators 22 and 23, the output of the phase comparator (23) that performed the phase comparison with the data clock D-CLK is passed through a high-pass filter, while the output of the phase comparator (22) that performed the phase comparison with the data DATA is passed through a low-pass filter; then, the two outputs are summed together in the control voltage generating circuit 24, and the VCO 25, with its operation controlled by the output (control voltage) of the control voltage generating circuit 24, generates the internal clock CLK 2.

In the clock generator of the second embodiment, as the clock guaranteed to be phase-synchronized is generated at the data transmitting side, the internal clock CLK 2 can be generated using circuitry simpler than the first embodiment; furthermore, as the data clock D-CLK is used, the internal clock can be generated with high accuracy even when the clock transition rate of the data is low. Another advantage of the second embodiment is that the steady state phase error between the data clock D-CLK and the data DATA does not affect the phase of the internal clock CLK 2 because the low frequency portion (including the DC component) of the result of the phase comparison with the data clock D-CLK is not used.

Figure 6:
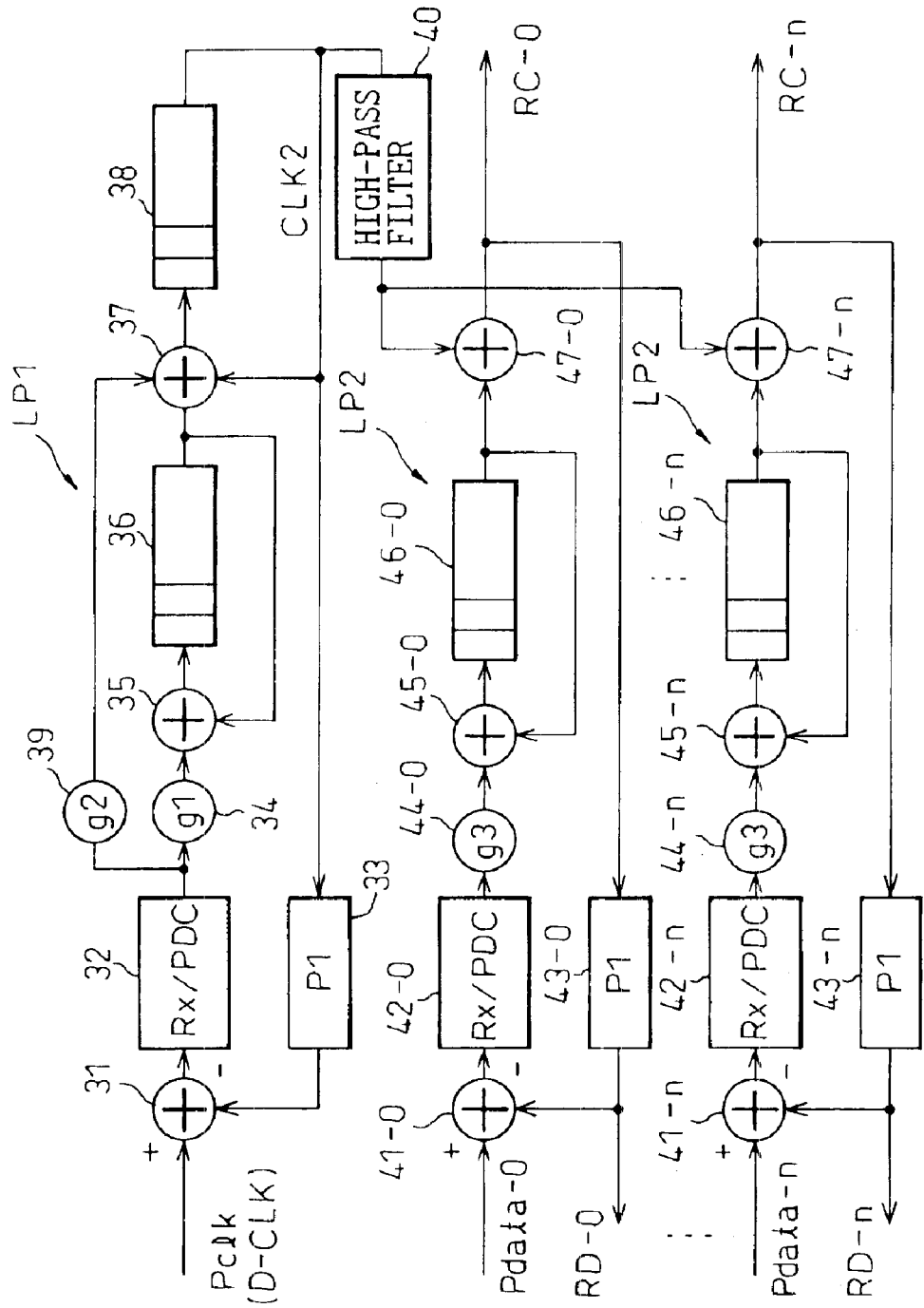
FIG. 6 is a block diagram conceptually showing a third embodiment of the clock generator according to the present invention.

FIG. 6 is a block diagram conceptually showing a third embodiment of the clock generator according to the present invention. In FIG. 6, reference numerals 31 and 41-0 to 41-$n$ are adders (subtractors); 32 and 42-0 to 42-$n$ are receiver/phase comparators (phase detectors); 33 and 43-0 to 43-$n$ are phase interpolators (PIs); 34, 39, and 44-0 to 44-$n$ are coefficient multipliers; 35, 37, 45-0 to 45-$n$, and 47-0 to 47-$n$ are adders; 36 is a frequency register (integrator circuit); 38 is a phase register (integrator circuit); 40 is a high-pass filter; and 46-0 to 46-$n$ are registers. Here, the frequency register 36 and the phase register 38 can be constructed using, for example, an adder and an accumulator.

The coefficient multiplier 34 multiplies the output of the receiver/phase detector 32 by a coefficient g1 and supplies the result to the adder 35, the coefficient multiplier 39 multiplies the output of the receiver/phase detector 32 by a coefficient g2 and supplies the result to the adder 37, and the coefficient multipliers 44-0 to 44-$n$ multiply the respective outputs of the receiver/phase detectors 42-0 to 42-$n$ by a coefficient g3 and supply the results to the respective adders 45-0 to 45-$n$.

In the clock generator of the third embodiment, the phase register 38 and the phase interpolator 33 (43-0 to 43-$n$) correspond to the VCO 5 in FIG. 2; the coefficient multipliers 34 and 39, the adder 35, and the frequency register 36 correspond to the charge pump 8 and high-pass filter 9 in FIG. 2; the receiver/phase detector 32 corresponds to the phase comparator 7 in FIG. 2; the coefficient multipliers 44-0 to 44-$n$, the adders 45-0 to 45-$n$, and the registers 46-0 to 46-$n$ correspond to the charge pump 2 and low-pass filter 3 in FIG. 2; and the receiver/phase detectors 42-0 to 42-$n$ correspond to the phase comparator 1 in FIG. 2. Further, the adders 47-0 to 47-$n$ each output a recovered code having phase information, while the outputs of the phase interpolators 43-0 to 43-$n$ are supplied to the subtractors 41-0 to 41-$n$ and, at the same time, are used as the data receiving clocks RD-0 to RD-n.

As shown in FIG. 6, in the clock generator of the third embodiment, for one data clock line Pclk (in the case of differential signals, for one pair of data clock lines) a plurality of data lines Pdata-0 to Pdata-n (for example, 16 data lines, or in the case of differential signals, 16 pairs) are provided and, for the respective data lines Pdata-0 to Pdata-n, the phase interpolators 43-0 to 43-$n$ for generating the respective receiving clocks are provided. The phase interpolators 33 and 43-0 to 43-$n$ are each a circuit that generates a signal of an arbitrary phase from the weighted sum of the two phases of the differential clocks (90 degrees apart in phase). Further, as the phase weight used in each of the phase interpolators 33 and 43-0 to 43-$n$ is controlled by a digital-analog converter (DAC), most of the control signal generation is done by digital processing. Each of the phase interpolators 33 and 43-0 to 43-$n$ is supplied, for example, with four phase clocks spaced 90 degrees apart in phase, and generates a signal of an arbitrary phase by performing weighting and addition operations on the four phase clocks.

In the clock generator of the third embodiment, the result of the phase comparison between the data clock D-CLK and the internal clock CLK 2 is input into the first phase locked loop LP 1. In this loop LP 1, the result of the phase comparison between the data clock D-CLK and the internal clock CLK 2 is integrated and fed back to the phase interpolator 33. The feedback loop LP 1 contains two registers that perform the integration: one is the frequency register 36 which accumulates the numeric value corresponding to the frequency offset between the data clock D-CLK and the reference clock output from the phase interpolator 33, and the other one is the phase register 38 which accumulates the numeric value corresponding to the phase of the data clock D-CLK. Of these two registers 36 and 38, the contents of the phase register 38 are used as an input to the data receiving feedback loop.

In the loop LP 2 for generating the data receiving clocks RD-0 to RD-n, phase errors are input at two ports on each of the adders 47-0 to 47-$n$. That is, one is the input port from the phase comparator (42-0 to 42-$n$) that performed the phase comparison between the data and the internal clock CLK 2, and the other is the input port that receives the contents of the phase register 38 from the data clock receiving loop LP 1.

In the clock generator of the third embodiment, data receiving clock phase codes RC-0 to RC-n are each generated by adding a prescribed bias value to the contents of the phase register 38 in the data clock receiving loop LP 1. The bias value is obtained from the feedback loop LP 2 to which the phase difference between the data and the internal clock is input. The clock phase codes RC-0 to RC-n are used, for example, for test purposes.

According to the clock generator of the third embodiment, the clocks RD-0 to RD-n for receiving multi-channel data can be generated. The high-frequency components of the phase difference are acquired from the data clock (D-CLK: Pclk) having a high clock transition rate, and skew between data channels is corrected based on the result of the phase comparison between the data and the internal clock. The clock generator of the third embodiment further offers the advantage that, as the skew mostly exhibits static changes, the skew correction can be done without a special startup protocol even when the clock transition rate of the data is considerably low.

Figure 7:
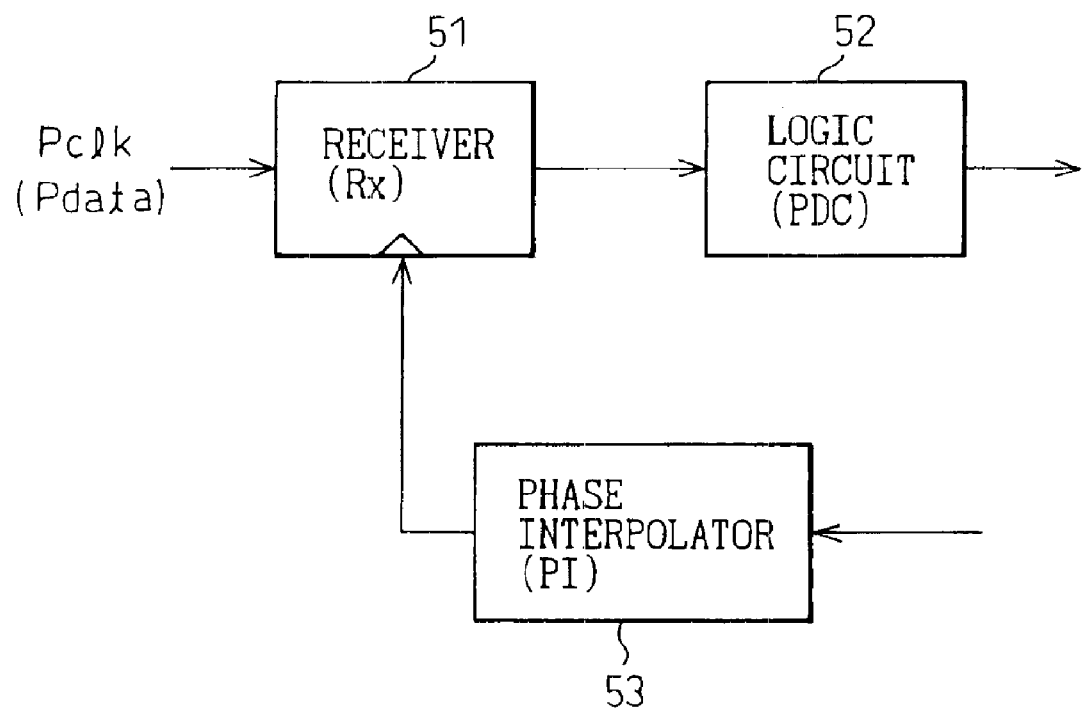
FIG. 7 is a block circuit diagram showing one configuration example of a portion of the clock generator according to the present invention.

FIG. 7 is a block circuit diagram showing one configuration example of a portion of the clock generator shown in FIG. 6, and more specifically, the circuit block corresponding the subtractors 31 and 41-1 to 41-$n$, the receiver/phase detectors (Rx/PDCs) 32 and 42-2 to 42-$n$, and the phase interpolators (PIs) 33 and 43-2 to 43-$n$.

That is, the subtractors 31 and 41-1 to 41-$n$ and the Rx/PDCs 32 and 42-2 to 42-$n$ in FIG. 6 each comprise, for example, a receiver (Rx) 51 which receives the output of the phase interpolator 53 (33 and 43-2 to 43-$n$) and a logic circuit (phase detection circuit, phase comparator circuit) which receives the output of the receiver 51.

Figure 8:
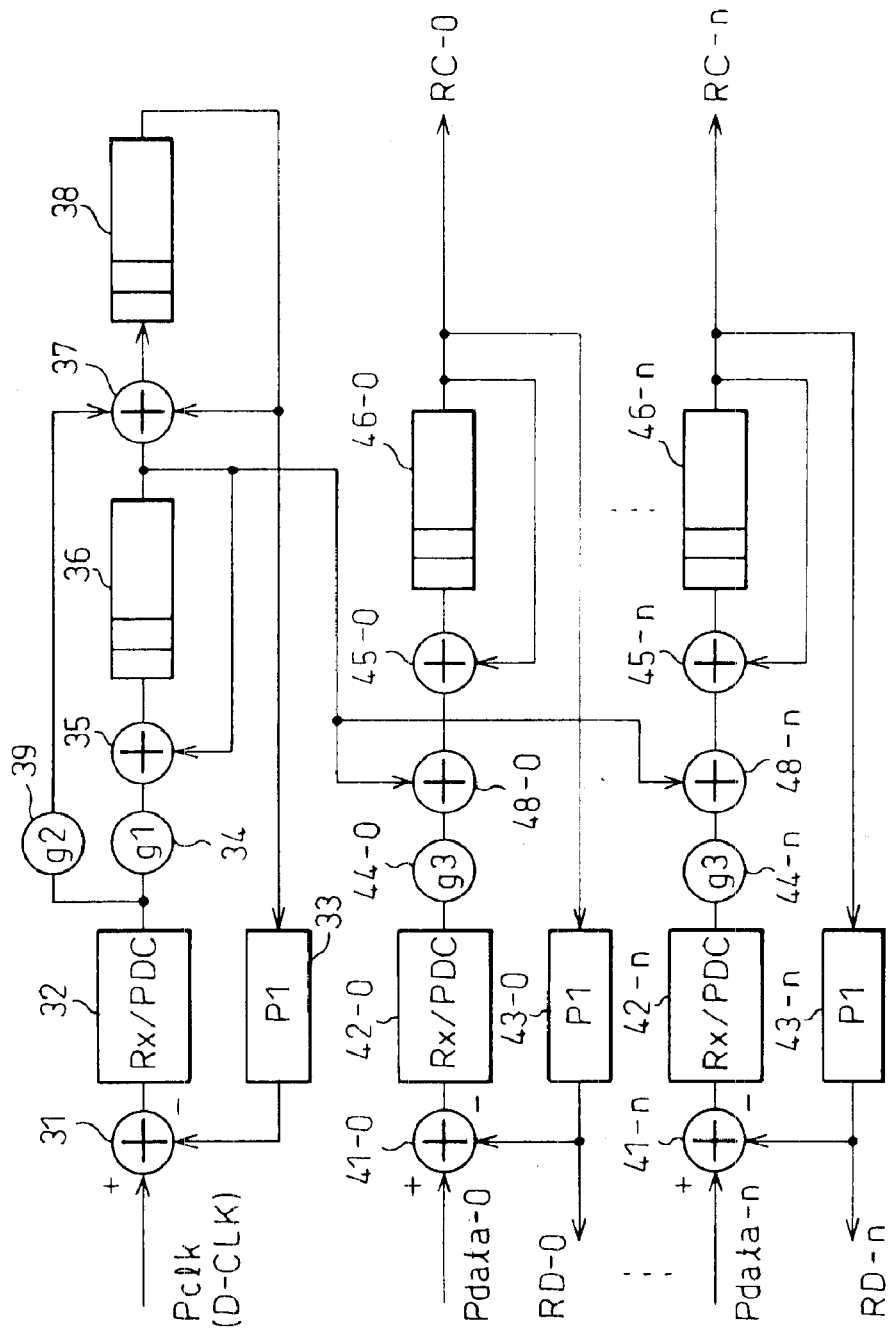
FIG. 8 is a block diagram conceptually showing a fourth embodiment of the clock generator according to the present invention.

FIG. 8 is a block diagram conceptually showing a fourth embodiment of the clock generator according to the present invention.

As is apparent from a comparison between FIGS. 6 and 8, the clock generator of the fourth embodiment differs from the clock generator of the foregoing third embodiment in that the high-pass filters 40 and the adders 47-0 to 47-$n$ are omitted and, instead, adders 48-0 to 48-$n$ for adding the output of the frequency register 36 to the respective outputs of the coefficient multipliers 44-0 to 44-$n$ are provided. That is, in the clock generator of the fourth embodiment, the contents of the frequency register 36 in the phase adjusting feedback loop (clock phase adjusting circuit) built into the circuit that receives the data clock D-CLK (Pclk) are supplied to each data receiving clock generating circuit (loop LP 2).

Here, the contents of the frequency register 36 correspond to the phase difference between the data and the reference clock. That is, in the clock generator of the fourth embodiment, the data clock D-CLK is used to extract the phase difference between the data and the reference clock; though information about the skew that differs for each data line (Pdata-0 to Pdata-n) is not contained in this phase difference information, the skew is reproduced using the detection result of the phase difference between the data and the internal clock.

In this way, in the clock generator of the fourth embodiment, information carrying the high-frequency components of the phase error but not containing skew information is obtained from the data clock receiving circuit (LP 1), and the phase adjusting signal is generated by combining this information with the DC component information obtained from the phase comparison between the data line and the internal clock. Accordingly, the high-frequency components and the low-frequency (DC) components can be combined automatically without having to perform special digital filtering operations, and this serves not only to stabilize the loop but also to further speed up the operation.

Figure 9:
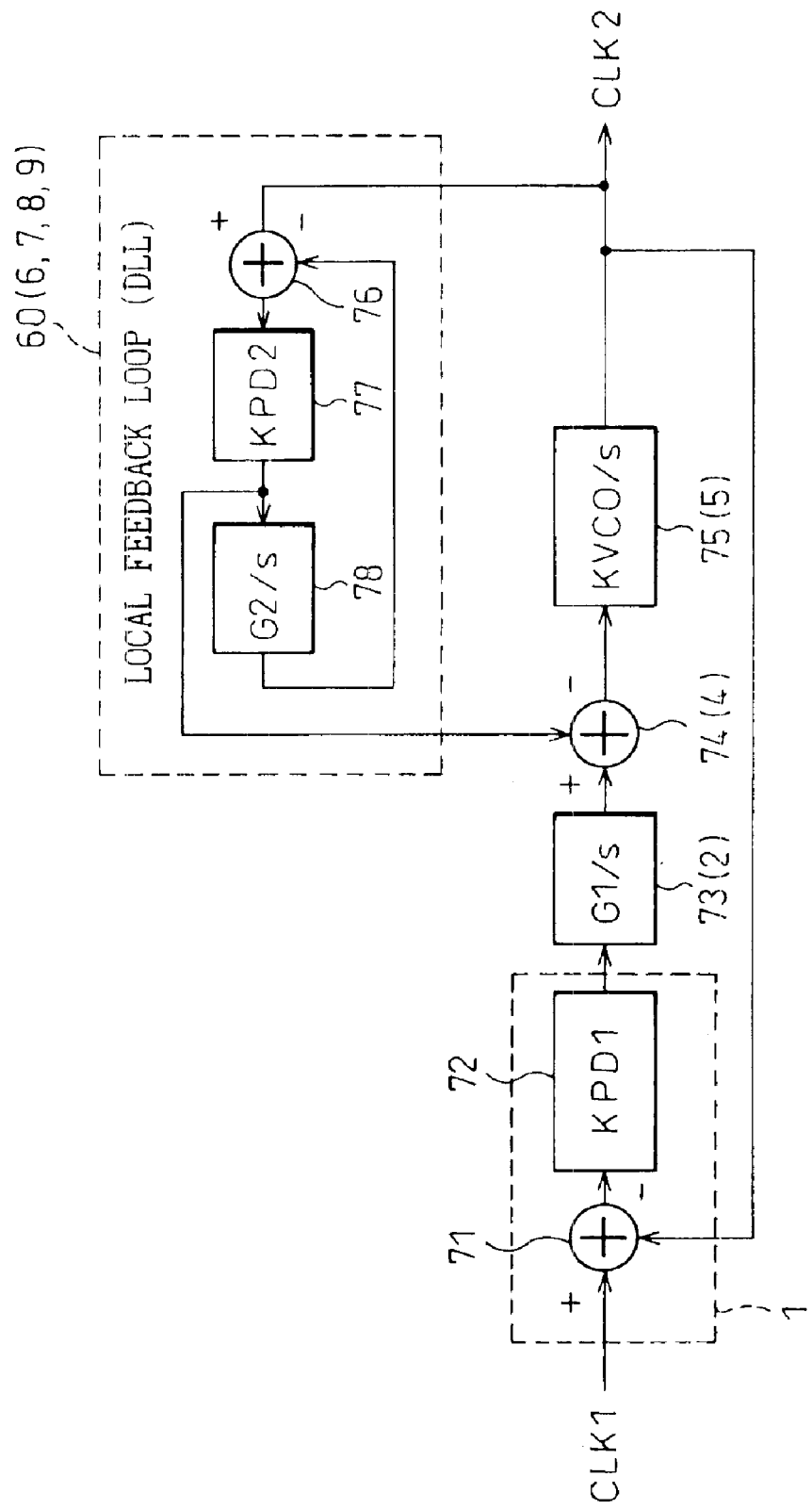
FIG. 9 is a block diagram showing a fifth embodiment of the clock generator according to the present invention.
Figure 10:
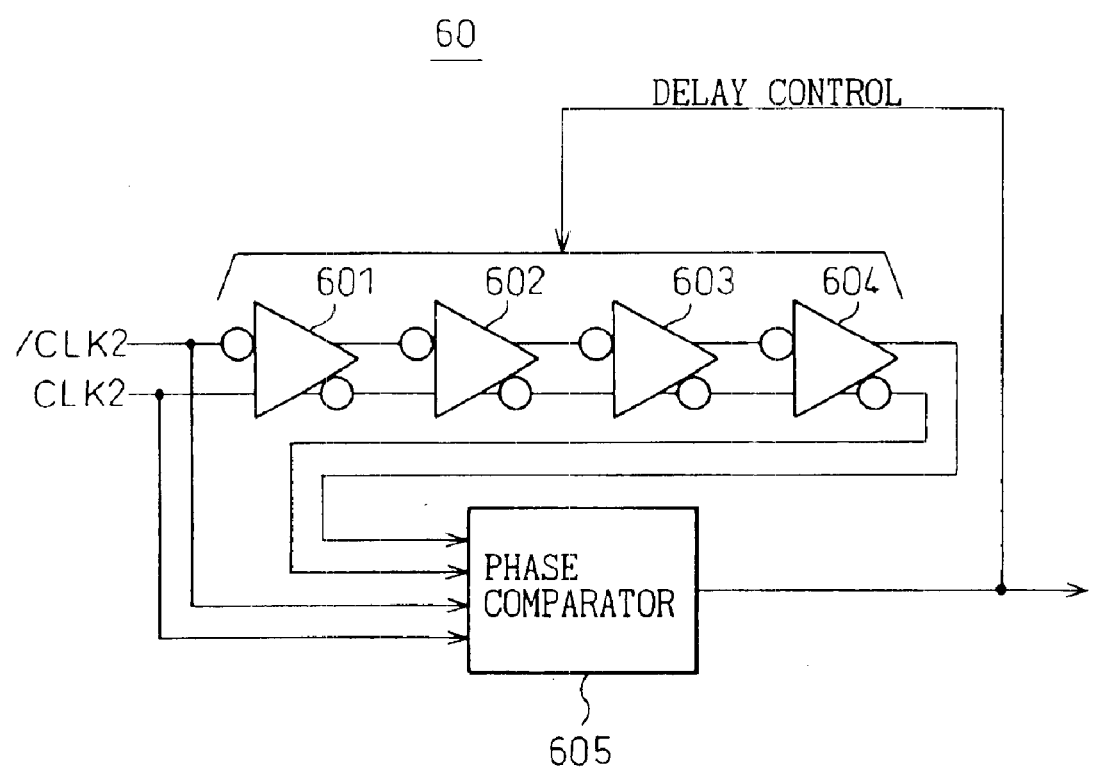
FIG. 10 is a circuit diagram showing an example of a phase-synchronized clock generating circuit in the clock generator of FIG. 9.

FIG. 9 is a block diagram showing a fifth embodiment of the clock generator according to the present invention; the block diagram here is given for analyzing an example of an application to a clock multiplying PLL which multiplies the external clock (CLK 1). FIG. 10 is a circuit diagram showing an example of the phase-synchronized clock generating circuit in the clock generator of FIG. 9.

As shown in FIGS. 9 and 10, in the clock generator of the fifth embodiment, indirect clock phase detecting means (local feedback loop) is a DLL (Delay Locked Loop) 60 which is synchronized to the internal clock (CLK 2); this DLL 60 uses four stages of differential delay elements (601 to 604), and the delay through these delay stages 601 to 604 is controlled by a control voltage and adjusted to a value equivalent to one clock cycle. Here, the DLL (local feedback loop) 60 in FIG. 9 is considered as having a subtracting element (adding element) 76, an amplifying element 77 providing a gain K, and an integrating element 78, and corresponds, for example, to the phase-synchronized clock generating circuit 6, the phase comparator 7 (76, 77), the charge pump 8 (78), and the high-pass filter 9 shown in FIG. 2. On the other hand, a subtracting element 71 and an amplifying element 72 in FIG. 9 correspond to the phase comparator 1 in FIG. 2, an integrating element 73 corresponds to the charge pump 2 in FIG. 2, a subtracting element 74 corresponds to the adder 4 in FIG. 2, and a VCO 75 corresponds to the VCO 5 in FIG. 2.

A phase comparator 605 compares the phase of the internal clock (differential clocks CLK 2, /CLK 2) with the phase of the clock passed through the delay stages 601 to 604 and, based on the result of the phase comparison, the charge pump is driven and the control voltage is generated to control the delay. Here, the phase comparator 605 can be considered as being an element (77) providing a predetermined gain (K) to the phase difference, while the charge pump can be considered as being an integrating element (78); therefore, the open loop gain G of this feedback circuit is $$G=K/s$$

Hence, the transfer characteristic is $$G/(1+G)=K/(s+K)$$

which is a linear response characteristic. Further, the transfer characteristic of the phase detector, with respect to the input phase, is $$E=1-G/(1+G)=s/(s+K)$$

This characteristic exhibits a high-pass characteristic (high-pass filter 9) for the input phase.

By incorporating the DLL as described above, as the phase information concerning the internal clock (CLK 2) can be obtained without using the external clock (CLK 1), the high-frequency components of the internal clock phase can be obtained even when the ratio of the external clock frequency to the internal clock frequency is small (the multiplication factor is large).

The signal output from the phase comparator 1 (71, 72), obtained by detecting the phase difference between the external clock CLK 1 and the internal clock CLK 2, is fed via the charge pump 2 (73) to the adder 4 (subtracting element 74) where it is summed with the signal obtained from the phase comparator 605 in the DLL 60, to generate the control signal (control voltage) for controlling the VCO 5 (75).

In the clock generator of the fifth embodiment, even when the frequency ratio of the external clock CLK 1 to the internal clock CLK 2 is small, the phase information of the internal clock can be obtained up to high frequencies because of the use of the DLL and, as a result, clock jitter can be reduced. Here, in the clock generator of the fifth embodiment, a PLL may be used as the DLL 60.

Figure 11:
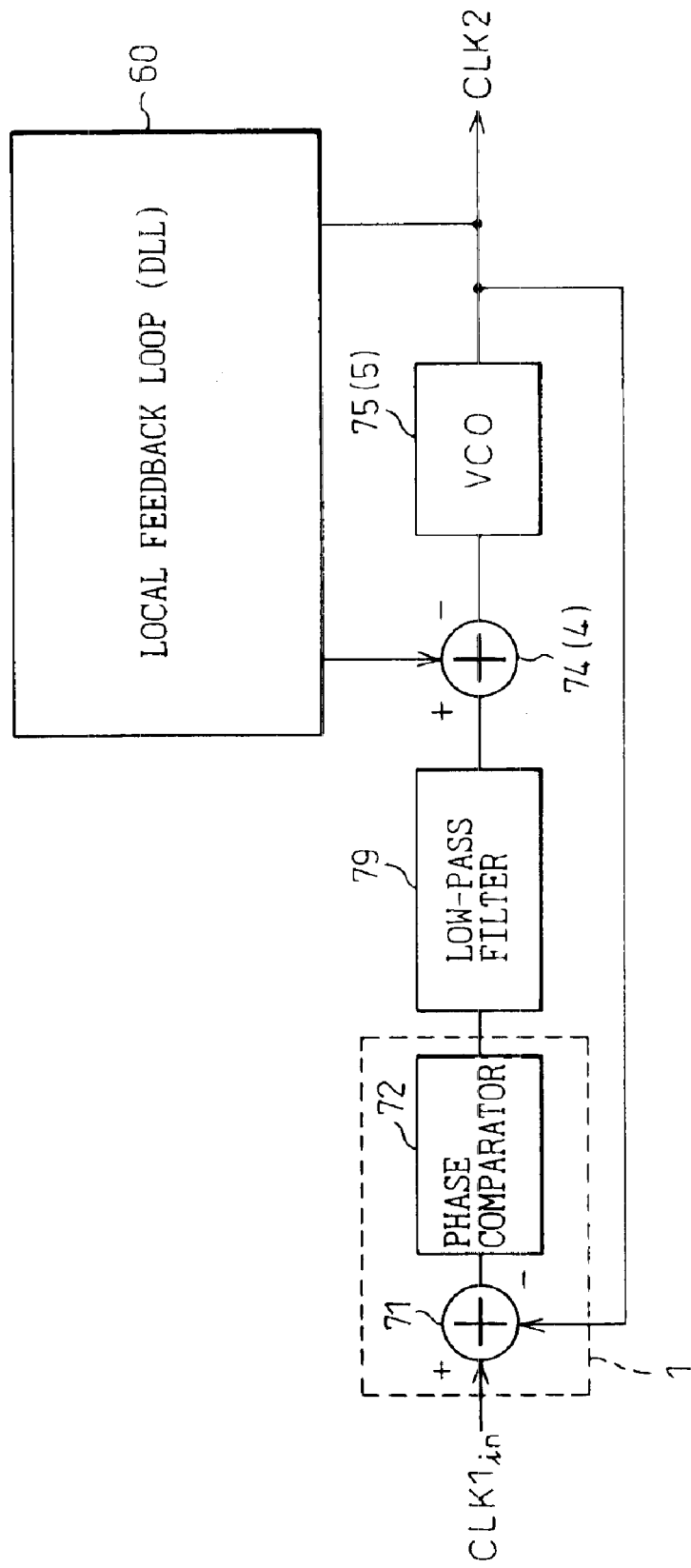
FIG. 11 is a block circuit diagram showing a sixth embodiment of the clock generator according to the present invention.

FIG. 11 is a block circuit diagram showing a sixth embodiment of the clock generator according to the present invention.

As is apparent from a comparison between FIGS. 9 and 11, in the clock generator of the sixth embodiment, the output of the phase comparator 1 (71,72), i.e., the result of the phase comparison between the external clock CLK 1 and the internal clock CLK 2, is supplied via a low-pass filter 79 to the adder 4 (74) where it is summed with the phase difference signal obtained from the DLL 60. Here, the low-pass filter 79 is constructed to have a low-pass filter cut-off frequency that matches the cut-off frequency realized by the high-pass characteristic s/(s+K) that the above-described DLL 60 possesses, and thus, an error-free phase difference signal (internal clock CLK 2) flat from the low frequency to the high frequency range is obtained.

That is, in the clock generator of the sixth embodiment, since the high-frequency components of the phase error of the internal clock CLK 2 are obtained from the DLL 60, phase information covering a wide range from DC to a high-frequency range can be obtained by combining, in the adder 4 (74), the high-pass filter cut-off frequency in the phase detection at the DLL 60 with the cut-off frequency of the low-pass filter 79. Then, by reducing the cut-off frequency for the phase information obtained from the external clock CLK 1, a low jitter clock can be generated even when the frequency of the external clock is low; furthermore, even if the external clock CLK 1 contains jitter, the jitter does not appear in the output (the jitter is not propagated) when generating the internal clock.

As described above, according to the embodiments of the clock generator of the present invention implementing a clock recovery circuit (or a reference clock generator, etc.) for use in a high-speed signal receiving circuit, as the phase information of the internal clock can be obtained up to high frequencies even when the clock transition rate of the input data or external clock is low, a low jitter clock can be generated, and as a result, a receiving circuit having a large receive timing margin can be achieved.

As described in detail above, according to the present invention, a clock generator can be provided that is capable of generating a low jitter clock, whether when generating the internal clock from data having a low clock transition rate or when generating the internal clock by multiplying an external clock by a high multiplication factor.

Many different embodiments of the present invention may be constructed without departing from the spirit and scope of the present invention, and it should be understood that the present invention is not limited to the specific embodiments described in this specification, except as defined in the appended claims.

What is claimed is:

1. A clock generator comprising:
   a clock generating circuit having a function for varying a clock phase in accordance with a control signal;
   a phase difference detection circuit comparing the clock phase output from said clock generating circuit with a phase of a reference waveform, and detecting a phase difference therebetween; and a control signal generating circuit generating the control signal for controlling the clock phase of said clock generating circuit, wherein:

said phase difference detection circuit comprises a plurality of phase detection units;

at least one of said plurality of phase detection units carries out a direct phase detection in which a phase of the clock is directly compared with the phase of the reference waveform; and at least one of the other of said plurality of phase detection units carries out an indirect phase detection using a phase-synchronized waveform generating circuit generating a waveform synchronized in phase with the reference waveform or an output of said clock generating circuit and a phase information extracting circuit extracting phase information from the phase-synchronized waveform, wherein the control signal is generated based on phase difference detection information from at least one of said plurality of phase detection units and at least one of the other of said plurality of phase detection units.

2. The clock generator as claimed in claim 1, wherein:

in the direct phase detection, the phase of the clock is compared with the phase of the reference waveform at a first frequency; and in the indirect phase detection, the phase of the clock is compared with the output of said phase-synchronized waveform generating circuit at a second frequency higher than the first frequency.

3. The clock generator as claimed in claim 2, wherein:

the direct phase detection is carried out by detecting a phase difference between the clock and externally supplied data; and the indirect phase detection is carried out by detecting a phase difference between the clock and a data clock synchronized to the externally supplied data.

4. The clock generator as claimed in claim 3, further comprising:

a clock phase adjusting circuit adjusting the phase of the clock in accordance with a signal generated by said plurality of phase detection units, and wherein a response speed characteristic that affects the phase of the clock is different for each output of said plurality of phase detection units.

5. The clock generator as claimed in claim 4, wherein:

data are transmitted on a plurality of data lines for one data clock line on which the data clock is transmitted;

said data clock line and said data lines are each provided with a clock generating circuit;

said clock generating circuit provided on said data clock line detects a phase difference between the clock generated by said clock generating circuit and the data clock, adjusts the phase of the clock based on a value of the detected phase difference, supplies the control signal used for adjusting the phase to said clock generating circuit provided on each of said data lines, and generates a clock control signal based on the supplied control signal and on a signal representing the phase difference between the clock and the data on said data line.

6. The clock generator as claimed in claim 5, wherein a value corresponding to a rate of increase in the phase of the data clock is obtained based on phase information obtained from said phase detection unit associated with said data clock line, and is supplied to said clock phase adjusting circuit on said each data line where the clock phase is adjusted based on information concerning the value and on information concerning the phase difference between the clock and the data on said data line.

7. The clock generator as claimed in claim 1, wherein detection of the clock phase is carried out by using:

the phase difference detection circuit comparing an external reference clock with the clock generated by said clock generating circuit, and detecting a phase difference therebetween; and a phase detection circuit detecting a phase of a PLL or DLL when the clock output from said clock generating circuit is supplied to said PLL or DLL.

8. The clock generator as claimed in claim 7, wherein a value obtained from a phase comparison between the external reference clock and the clock output from said clock generating circuit controls the phase of said clock generating circuit with a long time constant, and phase information obtained from said phase detection circuit of said PLL or DLL controls the phase of said clock generating circuit with a shorter time constant.

9. The clock generator as claimed in claim 1, wherein the control signal is generated by summing a first output from at least one of said plurality of phase detection units and a second output from at least one of the other of said plurality of phase detection units.

10. A clock generator comprising:

a first phase comparator carrying out a phase comparison between an externally supplied reference signal and an internal clock;

a phase-synchronized clock generating circuit generating a comparison clock synchronized in phase to the reference signal and having a higher clock transition rate than the reference signal;

a second phase comparator carrying out a phase comparison between the comparison clock and the internal clock;

an adder summing first phase difference information obtained from said first phase comparator and second phase difference information obtained from said second phase comparator; and an internal clock generating circuit generating the internal clock whose phase is adjusted in accordance with an output of said adder.

11. The clock generator as claimed in claim 10, wherein the reference signal is an externally supplied reference clock, and the internal clock is generated by multiplying the reference clock.

12. The clock generator as claimed in claim 11, wherein the phase-synchronized clock generating circuit is a multiplying circuit.

13. The clock generator as claimed in claim 10, wherein the reference signal is externally supplied data, and the internal clock is a clock for receiving the data.

14. The clock generator as claimed in claim 10, wherein:

the reference clock is a data clock transmitted on one data clock line with respect to data transmitted in parallel on a plurality of data lines;

the internal clock is generated as a plurality of data receiving clocks for receiving the respective data transmitted on said plurality of data lines;

said second phase comparator is provided for said data clock line;

said first phase comparator, said adder, and said internal clock generating circuit are provided for each of said plurality of data lines;

each of said adders sums the first phase difference information obtained from said first phase comparator associated therewith and the second phase difference information obtained from said second phase comparator; and each of said internal clock generating circuits generates the internal clock whose phase is adjusted in accordance with an output of said adder associated therewith.

15. The clock generator as claimed in claim 10, further comprising:

a low-pass filter allowing low frequencies contained in an output of said first phase comparator to be transmitted therethrough and supplied to said adder; and a high-pass filter allowing high frequencies contained in an output of said second phase comparator to be transmitted therethrough and supplied to said adder.

16. A clock generator comprising:

a clock generating circuit having a function for varying a clock phase in accordance with a control signal;

a phase difference detection circuit comparing the clock phase output from said clock generating circuit with a phase of a reference waveform, and detecting a phase difference therebetween; and a control signal generating circuit generating a control signal for controlling the clock phase of said clock generating circuit, based on phase difference information obtained from said phase difference detection circuit, wherein:

said phase difference detection circuit comprises a plurality of phase detection units;

at least one of said plurality of phase detection units carries out a direct phase detection in which a phase of the clock is directly compared with the phase of the reference waveform; and at least one of the other of said plurality of phase detection units carries out an indirect phase detection by detecting a phase difference between the clock and a data clock synchronized to the externally supplied data using a phase-synchronized waveform generating circuit generating a waveform synchronized in phase with the reference waveform or an output of said clock generating circuit and a phase information extracting circuit extracting phase information from the phase-synchronized waveform.

* * * * *